United States Patent [19]

Cutcher

[11] Patent Number: 5,388,509

[45] Date of Patent: Feb. 14, 1995

[54] METHOD FOR MAKING A PRINTING SCREEN AND PRINTING A VARIBALE THICKNESS PATTERN

[76] Inventor: Thomas V. Cutcher, 5045 Summerfield Rd., Petersburg, Mich. 49270

[21] Appl. No.: 57,680

[22] Filed: May 5, 1993

[51] Int. Cl.⁶ .............................................. B41F 15/36
[52] U.S. Cl. ................... 101/128.21; 101/129; 427/282; 427/287
[58] Field of Search ............... 101/127, 128.21, 128.4, 101/129; 427/282, 287; 219/203, 522, 543; 430/308

[56] References Cited

U.S. PATENT DOCUMENTS

| | | | |
|---|---|---|---|
| 3,532,052 | 10/1970 | Erickson | 101/128.21 |
| 3,643,597 | 2/1972 | Lala | 101/128.21 |
| 3,851,581 | 12/1974 | Baum et al. | 430/308 |
| 3,852,564 | 12/1974 | Baum et al. | 219/522 |
| 4,379,737 | 4/1983 | Mearig | 205/75 |
| 4,791,006 | 12/1988 | Galvagni et al. | 427/282 |
| 4,958,560 | 9/1990 | Collins | 101/128.21 |
| 4,975,860 | 12/1990 | Kitaya et al. | 395/109 |
| 5,093,160 | 3/1992 | Johnson et al. | 101/129 |
| 5,156,089 | 10/1992 | McCue et al. | 101/128.4 |
| 5,240,816 | 8/1993 | Noguchi et al. | 101/129 |

FOREIGN PATENT DOCUMENTS

| | | | |
|---|---|---|---|
| 34462 | 2/1983 | Japan | 101/128.21 |
| 144396 | 6/1986 | Japan | 101/128.21 |
| 9580 | 1/1988 | Japan | 101/127 |
| 34395 | 2/1990 | Japan | 101/128.21 |
| 76792 | 3/1990 | Japan | 101/127 |
| 2176630 | 12/1986 | United Kingdom | 101/128.21 |

*Primary Examiner*—Edgar S. Burr
*Assistant Examiner*—Stephen R. Funk
*Attorney, Agent, or Firm*—Marshall & Melhorn

[57] ABSTRACT

A printing screen, a process of making such a printing screen, and a method of screen printing on hard non-absorbent materials, such as glass, are provided to form a pattern with selected areas of variable thickness. A pattern is formed in the screen utilizing an emulsion coating which has been hardened in the usual manner. A second pattern is formed in a second emulsion coating on a surface of the screen in at least one area of the first pattern. The second emulsion coating is substantially thicker than the first coat and includes a specific dot size and arrangement to achieve additional support, which results in a greater thickness of ceramic ink being deposited when the screen is in use. The dots are arranged in a spaced-apart relationship to provide a durable and high quality screen. The dots are sized based on the mesh opening size of the fabric used in the screen. By sizing the dots to match the mesh size, the life of the screen may be increased because the dots are stronger and will effectively reduce the crumbling and cracking of emulsion dots during regular production use.

12 Claims, 5 Drawing Sheets

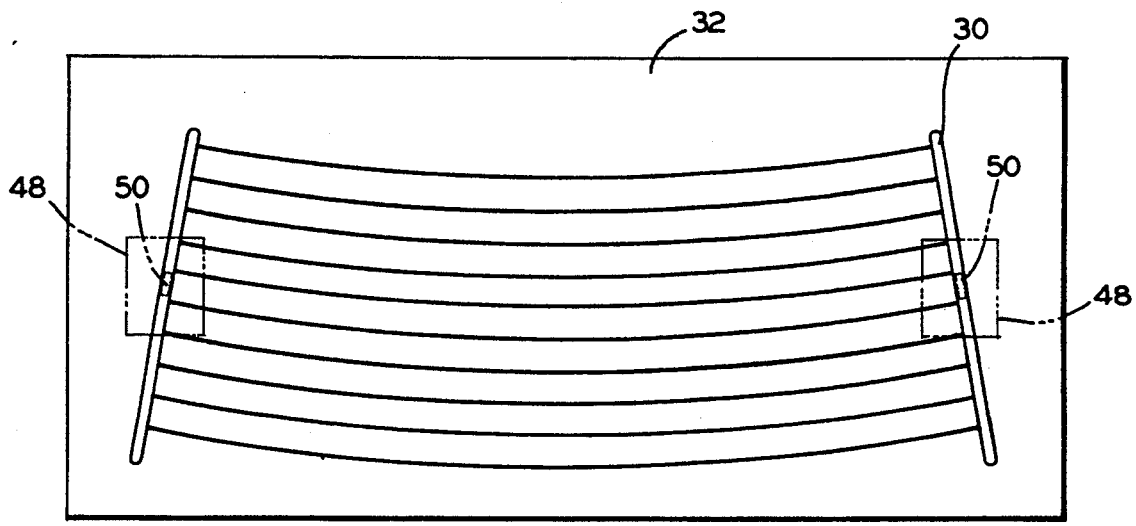
FIG. 2
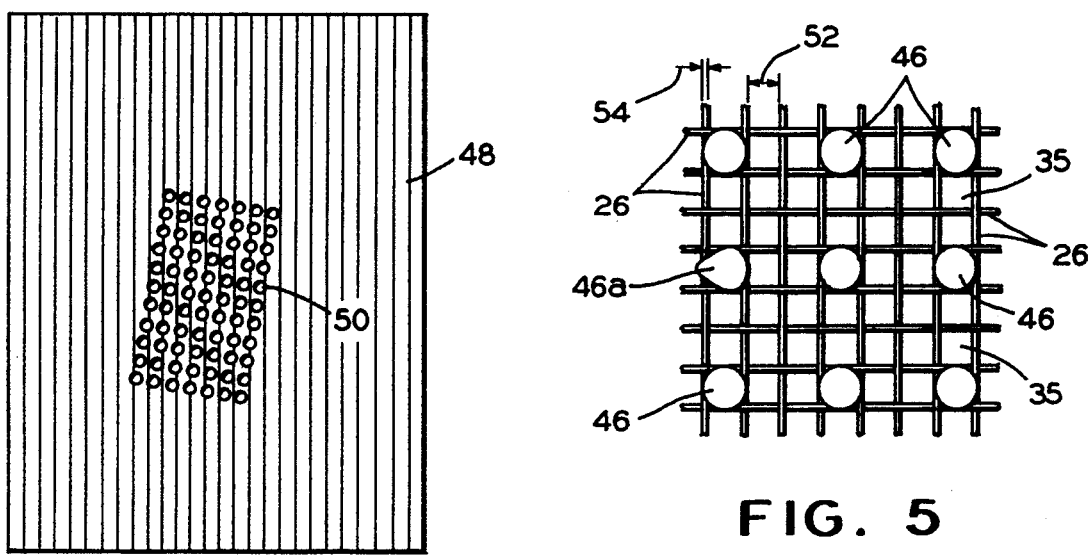
FIG. 3
FIG. 5
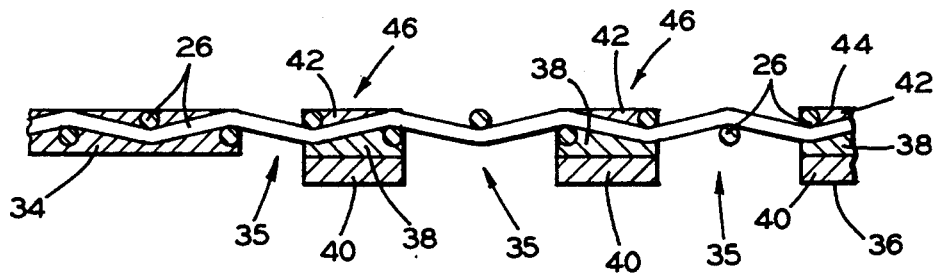
FIG. 4

METHOD FOR MAKING A PRINTING SCREEN AND PRINTING A VARIBALE THICKNESS PATTERN

BACKGROUND OF THE INVENTION

1. Field of the Invention

The invention relates to a novel printing screen, a process of making such a printing screen, and a method of screen printing on hard non-absorbent materials, such as glass, to provide a pattern with selected areas of variable ink thickness.

2. Summary of Related Art

Screen printing is an important process in making automotive glass and other glass components, for making printed circuit boards, and for a number of other applications where a specific electrical pattern is printed on a hard substrate surface.

In the glass manufacturing process, screen printing is used to print the electrically conducting networks for heater arrays on rear windows and backlights. Such heater arrays on the glass generally comprise an array of heating conductors extending across the window between bus bars adjacent the lateral edges of the glass.

The heater array may be printed on one surface of a piece of glass before the glass is heated for bending and hardening. A ceramic ink/paint with an electrical conductor, such as silver, is used to form the heater pattern during the screening process. The wet ceramic ink is spread on the screen during production use. A squeegee blade is pressed across the screen to force ink through the screen in any of the apertures in the screen coating. A return run of the squeegee blade back across the screen forces the ink onto the surface of the glass.

It is desirable to increase the thickness of the printed ink pattern at one or more locations to selectively increase the conductance of parts of the pattern such as bus bars, to provide a thicker connector to solder leads to a bus bar, or for a number of other purposes in connection with automotive glass and other applications.

In addition to electrically conductive networks, screen printing is also used to provide ceramic masks for tinted windows and obscuration areas along the edge of a window. Color masking with a graduation area along an edge of a window glass of an automobile is often performed to hide mechanical components and structure along the edge of the window. Screen printing may also be used to provide a mask or dot pattern used to tint windows for sun screening purposes.

Various printing screen structures and manufacturing methods are known in the art. The typical printing screen for automotive glass starts by preparing the original pattern as a positive film, and then transferring the positive image on a positive film to a full-size photosensitive transparency. A screen is prepared by coating the screen with a photosensitive emulsion and placing the transparency on the screen. A light source on the transparency side of the screen is switched on for the required exposure time. The screen is separated from the transparency and the non-exposed areas of emulsion are washed away to form the desired pattern in the screen.

A number of U.S. patents have discussed a method for achieving the desired patterned ink layer of variable thickness. U.S. Pat. Nos. 3,851,581 and 3,852,564 to Baum et al disclose a method of making a silk screen and the manufacture of electrically heated windows. The references teach a screen having a uniform thickness and that the uniform thickness may be varied by depositing successive layers of emulsion. The layers of emulsion will not harden properly if the emulsion is too thick. Multiple layers of emulsion are used to build up the screen, with each layer being dried and hardened before applying a subsequent layer. The same transparency is used for each layer of emulsion and it is essential that the transparency be positioned exactly to the pattern.

U.S. Pat. No. 4,958,560 to Collins teaches a method of screen printing a patterned ink layer using a screen with a patterned coating on its surface facing the substrate. The reference discloses that the thickness of a patterned ink layer screen printed on a glass surface can be increased in selected areas by providing local support between the screen surface and the glass in the selected areas. One of the methods for providing the local support between the glass and the screen to increase ink retention in those areas is an array of spots of coating on the screen. Another method of support is to provide extra patches of screen in the selected areas.

The automatic drawing apparatus disclosed in U.S. Pat. No. 4,975,860 to Kitaya et al may be used to develop dot patterns. The design of the dot patterns may be evaluated and modifications in the pattern may be completed on the apparatus. The patterns used to form the array of dots for a screen process may be generated in a cost efficient manner.

U.S. Pat. No. 4,379,737 to Mearig and U.S. Pat. No. 4,791,006 to Galvagni et al disclose additional methods for providing variable thickness build up. Mearig teaches a rotary printing screen having a built area to achieve additional thickness. Galvagni et al method is a high accuracy method for forming conductive paths of varying thickness.

The screens and the method for screen printing referred to in the above references suffer from a number of disadvantages. Glass manufacturers are still working to develop a fast, convenient, and cost effective means for screen printing which will provide the variable thickness ink in the desired patterns. Similar methods could also be applied to a number of other screen printing applications, such as printed circuit boards.

One of the problems presently encountered during screen printing operations is using a number of layers of emulsion to achieve the desired variable thickness in the specified pattern. Such a procedure increases the time and cost in preparing a screen. The emulsions must be properly hardened before the next layer is added or the support dots will break off during production operation.

In the glass industry, there is a need for a low cost screen which will furnish the extra thickness of ceramic ink to provide a thicker conductor for weld points and other similar applications. The screen must be rugged for use on a sufficient number of production pieces of glass without the disintegration of the hardened emulsion.

In a dot pattern, the dots in many screen designs have a tendency to crumble when used in production. The blade delivering the ceramic ink to the screen places a downward force on the screen. If the hardened emulsion dots crumble, the screen becomes ineffective for furnishing increased ink to the glass and emulsion pieces may cause quality problems in printing the pattern on the glass, which may cause the complete piece of glass to be rejected.

SUMMARY OF THE INVENTION

In accordance with the present invention, there is provided a printing screen, a process of making such a printing screen, and a method of screen printing on hard non-absorbent materials, such as glass, to provide a pattern with selected areas of variable thickness. A pattern is formed in the screen utilizing an emulsion coating which has been hardened in the usual manner. A second pattern is formed in a second emulsion coating on a surface of the screen in at least one area of the first pattern. The second emulsion coating is substantially thicker than the first coat and includes a specific dot size and arrangement to achieve additional support, which results in a greater thickness of ceramic ink being deposited when the screen is in use.

The method of making such a printing screen and for printing a pattern on a glass substrate provide an efficient and effective means for providing an increased thickness of ink in the desired area. An object of the present invention is to achieve a thicker layer of ceramic ink in a designated area during a single application of the ink in the printing area of the production line.

An object of the present invention is to provide a printing screen with an efficient and cost effective means of forming a pattern having different emulsion thicknesses such that an increased thickness of ceramic ink is achieved in the desired areas. By adding a second emulsion process, but limiting such emulsion process to only the specific areas of increased thickness, the screen can be formed with a minimum of additional processing beyond the initial layer of emulsion on the screen. Printing the different thicknesses of ceramic ink in one printing step on the glass production line instead of using two printing operations to achieve the extra thick layer of ink also results in substantial production cost savings.

An object of the present invention is to increase the strength of the emulsion dots to increase the life of the screen. The diameter of the dots is determined in relationship to the mesh size of the screen. By varying the mesh size of the screen and the dot pattern in the mesh, the desired ink pattern can be achieved using a printing screen with a longer screen life.

A further object of the present invention is to use dot patterns of the present invention to provide electrical circuits and antennas on hard substrates such as glass. In addition, the dot pattern may also be used for applying coatings to glass, such as in the tinting process.

An object of the present invention is to improve product quality for screen printing glass such that the solderability of the designated area is improved. The need for special bus bar treatment prior to soldering is eliminated. In many cases, the solder point on the bus bar must be chemically treated in order to achieve the desired solder joint. The present invention eliminates this process step, which reduces production costs and the necessity of handling and disposing of chemical waste. In addition, the improved solderability should be available without having to cool the furnace during the glass bending process.

BRIEF DESCRIPTION OF THE DRAWINGS

The above, as well as other advantages of the present invention, will become readily apparent to those skilled in the art from the following detailed description of a preferred embodiment when considered in the light of the accompanying drawings in which:

FIG. 2 is a diagrammatic view of the art work transparency used to produce a printing screen for printing a heater array;

FIG. 3 is an enlarged diagrammatic view of the detail sections shown in FIG. 1 in which the additional thickness of ceramic ink is desired;

FIG. 4 is an enlarged side view of the screen showing the thinner layer of emulsion and the thicker dots of emulsion;

FIG. 5 is an enlarged plan view of the printing screen with the dot pattern for the detailed sections;

DESCRIPTION OF THE PREFERRED EMBODIMENT

Figure 1:
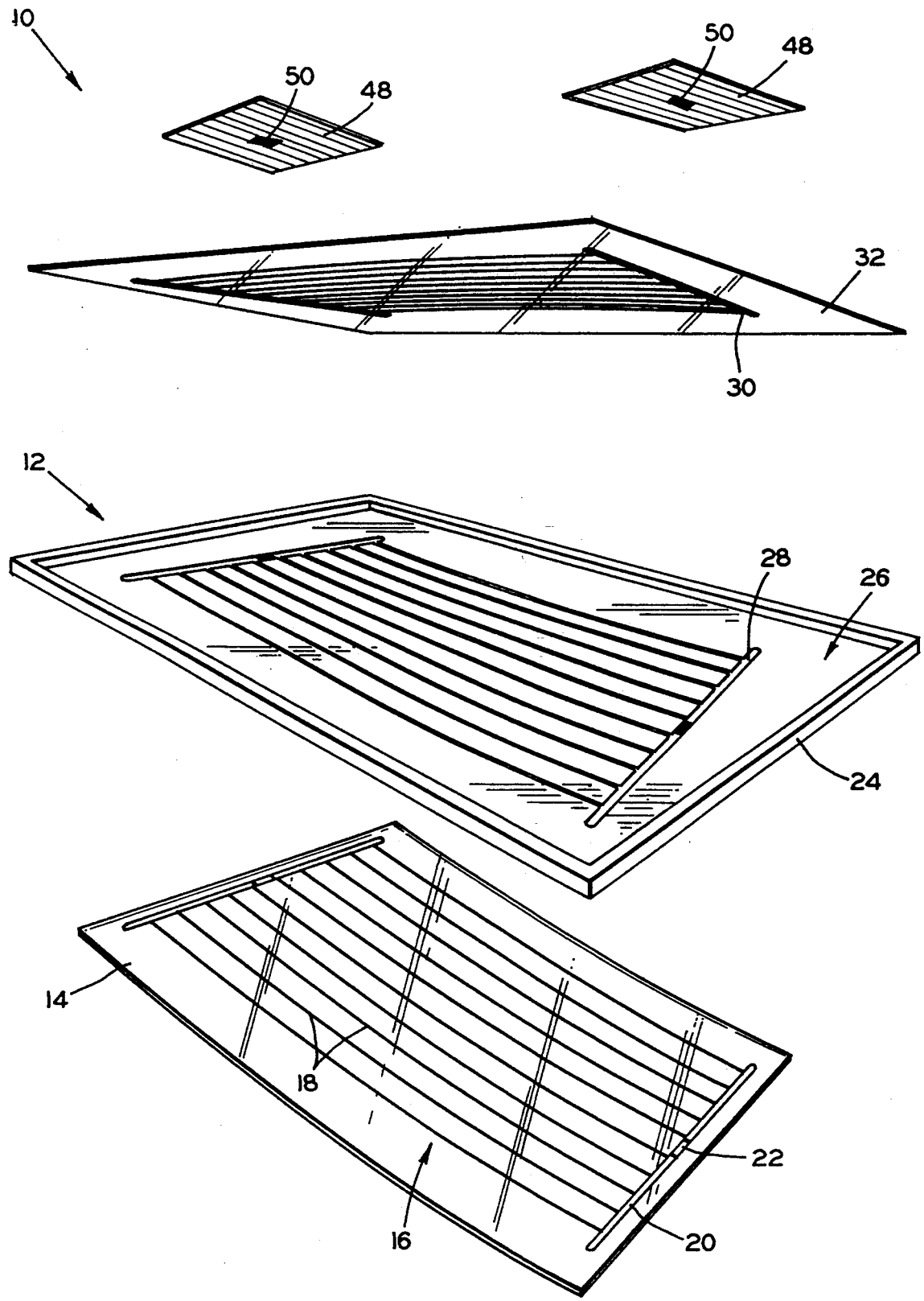
FIG. 1 is a schematic illustration of art work transparencies, a printing screen, and a piece of glass for printing a heater array on the piece of glass.

Referring now to the drawings, there is illustrated in diagrammatic fashion a printing screen and a method of forming and using the printing screen to apply materials of different depth. As will be evident to those skilled in the art, the mesh size of the screen and the dot patterns have been enlarged and simplified for purposes of illustration.

FIG. 1 illustrates a set of art work transparencies 10, a printing screen 12, and a piece of glass 14 for printing a heater array 16 on the piece of glass 14 for use as a rear window in an automobile. The heater array 16 is an electrically conducting network printed on the glass 14 which de-mists or de-ices the glass 14.

The heater array 16 includes electrical resistance heating conductors 18 extending between two bus bars 20 in the known manner. The heater array 16 is screen printed to the glass 14 using a paint-like ceramic ink which includes silver as the conductive material. The bus bars 20 are provided with an integral raised segment 22 containing a thicker layer of the ceramic ink, which improves conductivity and provides a superior surface for soldering electrical connectors (not shown) to the bus bars 20.

The heater array 16 is printed onto the glass using a known printing system which includes a squeegee blade (not shown) which forces the ceramic ink through the open mesh in the printing screen 12. After the heater array 16 is screen printed onto the glass 14, the ceramic ink is then fired onto the glass 14 when the glass 14 is heated as part of the bending process for forming the desired shape.

The printing screen 12 used in the printing process includes a frame 24 stretched with a mesh fabric 26. A number of fabrics may be used, such as 160 mesh, white monofilament polyester mesh. The 160 mesh fabric 26 has a threaded diameter of 0.002 inches and a mesh opening of 0.004 inches by 0.004 inches. The required screen pattern 28 on the printing screen 12 is defined by a photosensitive coating on the fabric 26 of the screen 12.

The original art work pattern is produced and formed as a positive film pattern 30 on the art work transparencies 10. A number of existing computer-aided-design systems are available for converting the three-dimensional requirements of the heater array 16 into the two-dimensional film pattern 30. The film pattern 30 is formed on transparencies 10 for use in forming the printing screen 12.

After the fabric 26 is mounted in the frame 24, the fabric 26 of the screen 12 is coated with a photosensitive emulsion 34, such as "Majestech Universol Plus" or "Autosol Plus". The emulsion 34 is dried and the art work transparency 10 with the heater array film pattern 30 is placed against the emulsion 34 on the fabric 26. A light source is then placed adjacent to the transparency 10 and the emulsion 34 is exposed to the light for the necessary time to properly harden the emulsion 34 on the screen which was exposed to the light source. The transparency 10 is removed from the screen 12 and the fabric 26 of the screen 12 is washed to dissolve the unexposed areas of the emulsion 34. The film pattern 30 prevents light from reaching the emulsion 34 and forms the unexposed areas which are washed away to form the screen pattern 28. The ceramic ink is forced onto the glass 14 through the mesh openings in the screen pattern 28.

The emulsion 34 thickness for the initial coating of the fabric 26, after drying, is equal to the thickness of the fabric plus 10% to 25%. The additional thickness of emulsion 34 helps to maintain the ceramic ink in the conductor lines when the squeegee blade applies the ink to the screen 12. The emulsion 34 keeps the lines of the conductors sharp, even when higher than normal pressure is applied to the blade in order to force the necessary ink through the screen 12 in the area of the raised segments 22. The total fabric thickness for the fabric 26 is approximately 75–80 microns.

The primary art work transparency 32 is positioned on the screen 12 and the photosensitive emulsion 34 on the screen 12 is exposed to a light source in the normal manner. The transparency 32 is separated from the screen 12 and the fabric 26 is washed to dissolve away the non-exposed areas of the emulsion 34. The screen pattern 28 is now defined by the open mesh areas 35 in the hardened emulsion 34 for the heater array 16, including the conductors 18 and bus bars 20.

When the screening process was initially introduced for automotive glass use, the screen 12 was ready for production use after formation of the initial screen pattern 28. However, in the open mesh areas 35, there was a tendency for the mesh fabric 26 to flatten out as the squeegee was used to transfer ink through the open mesh area 35 to the glass 14.

When the mesh fabric 26 flattens out in the open mesh areas 35, the result is that less ink is transferred through the screen 12 to the glass 14. In order to achieve the raised ink segments 22 on the glass 14, the mesh fabric 26 may be supported by raised emulsion dots 46. The raised emulsion dots 46 support the mesh fabric and permits more ink to pass through open mesh areas 35, which results in the desired increase in thickness of the ink at the raised segments 22. The raised emulsion dots 46 are approximately twice as thick as the initial emulsion layer 34.

After the initial pattern 28 is formed in the screen 12, the screen 12 is now ready for the formation of the raised emulsion dots 46 to provide the raised segments 22 on the bus bar portion of the heater array 16. The glass side 36 of the screen 12, which is the side of the screen which engages the glass 14 during the printing process, is coated with a photosensitive emulsion 38. The emulsion 38 is preferably a clear emulsion, which permits a thicker layer of emulsion to be hardened during the light exposure process.

A piece of capillary emulsion film 40 is applied to the glass side 36 of the screen 12 while the clear emulsion 38 is still wet. The capillary film 40 is a piece of dried emulsion that has yet to be exposed to the light source to harden the emulsion. The clear emulsion 38 and the capillary emulsion film 40 are applied locally in the area on and about the open mesh areas 35 where a raised segment 22 is desired. The emulsion for the raised emulsion dots 46 of the present invention is not a build-up on top of the initial layer of emulsion 34 applied to the screen 12, but is an independent build up of emulsion in open mesh area 35 of the initial screen pattern 28.

While the clear emulsion 38 is still wet, a coating of regular emulsion 42 is added to ink side 44 of the screen 12. In the printing process, the ink or paint is placed on the ink side 44 of the screen 12 and squeegee is moved across the ink side 44 of the screen 12 to force ink through any open mesh segment of the screen 12 to print the desired pattern.

The clear emulsion 38, the capillary emulsion film 40, and the emulsion layer 42 are allowed to dry to form an integral layer of emulsion 46 (FIG. 4). The total thickness of this integral layer of emulsion, which is used to form the raised dots 46, is approximately twice as thick as the initial layer of emulsion 34.

After the emulsion has dried, dot pattern transparencies, as shown in FIG. 3, are attached to the screen 12 such that the dots are in the desired location on the screen pattern. The original art work pattern is produced and formed as a positive film pattern 50 on the dot pattern transparencies 48. Only the raised emulsion dots 46 need to be exposed since the emulsion 34 has previously been exposed and hardened. The dot pattern 50 is clear to permit the passage of light to harden the various photosensitive emulsion sections 38, 40, 42 of the dots 46. The balance of the transparency 48 is a darkened film. The transparency 48 may be sized to cover the emulsion area, which results in small and cost effective transparencies 48. The light source can be a much smaller light source concentrated in the area of the emulsions. The exposure of the limited areas requires less energy and processing time as compared to exposing the complete screen 12.

The method for exposing the emulsion typically provides for the light source to be positioned on the glass side 36 of the screen 12. A two step process with two separate exposures is needed for creating the screen. The first step includes the formation of the basic screen pattern 28 and the second step provides for the formation of the raised emulsion dots 46.

Moving the light source from the glass side 36 of the screen 12 to the ink side 44 of the screen permits the formation of a screen 12 in a single exposure. The emulsion for the basic screen pattern 28 and the dots 46 are exposed in a one step process. The film transparencies 32 and 48 can be combined into one transparency and attached to the screen at the same time. From the ink side exposure, the clear emulsion 38, capillary film emulsion 40, and the emulsion 42 will achieve the desired hardness in approximately the same time as the regular and thinner emulsion 34 on the screen 12.

An important consideration when forming the dot film pattern 50 is the size of the dots 46. During the printing process, the dots 46 are subject to the pressure of the squeegee each time a piece of glass 14 is printed. The screens 12 have a limited life, depending primarily on the deterioration of the hardened emulsion. Typically, a screen can be used on several thousand pieces of glass before being replaced. The emulsion dots 46, because of their thickness and because of the spacing, are frequently cracked and disintegrating to the point where the screen 12 is no longer usable.

In order to strengthen the dots 46 and improve the life of the screen 12, the dots 46 may be sized to match the mesh of the fabric 26. The preferred size of the dots 46 is such that the diameter of the dots 46 is equal to the length of the mesh opening 52 plus the diameter of the two mesh threads 54 on opposite sides of the mesh opening 52. In such a configuration, the outer surface of the dots 46 bonds to and is supported by the threads 54, which results in longer screen life. Other dot sizes are acceptable, although the useful life of the screen 12 may be diminished when the outer surface of the dot 46 is in the mesh opening 52. In addition to the round shape for the raised emulsion dots 46, other irregular and geometric shaped dots may be used. A tear-shaped drop 46a is shown in FIG. 4.

If larger or smaller dots are needed to achieve the desired ink pattern, changing the size of the mesh opening 52 on the fabric 26, and then sizing the dots 46 to match the mesh opening 52, is the preferred method compared to simply increasing the size of the dots 46. Various microscopes and measuring devices may be used to record emulsion thickness and dot sizes.

The film positive 50 required to accomplish the dot sizes includes dots which are smaller than the actual dot size 46. The lights in the exposure process will undercut the edge of the circumference of the dot on the film positive 50. Therefore, the dot on the film positive 50 should be slightly smaller (1–2 microns) than the desired circumference of the actual dots 46.

Varying the pattern and the distance between dots 46 may be used to control the ink deposit. The emulsion thickness of the dots 46 may be adjusted to control the ink deposit. By controlling the pattern, spacing, and thickness of the dots 46, the thickness of the ink may be varied to meet the requirements for screening the glass 14.

Abrupt changes in the thickness of the ink, such as from the bus bar 20 to the raised segment 22 in heater array 16, may present problems from a manufacturing and product use standpoint. The squeegee may catch on the dots 46 for the raised segment area and break off the dots 46 from the screen 12, which shortens the life of the screen 12. From a product use standpoint, the raised segment 22 with taper would be less likely to be damaged by cracking or other usage problems once the glass is in service. The problems may be minimized based on the configuration of the dots. A wider spacing of the dots or even the removal of dots around the edges of the film pattern 50 will cause a less abrupt change in the thickness of the ink. The thickness of the emulsion around the edges of the desired pattern may also be tapered in the desired manner to achieve a ramp for the raised segment 22.

A problem which is occasionally encountered in production use of the screen 12 is the buildup of ceramic ink in the mesh openings 35 about the dots 46. Instead of facilitating the flow of additional ceramic ink to provide the raised segment 22, the clogged mesh openings 35 reduce the amount of ceramic ink deposited on the glass 14. Chemical treatments and sealers may be used to seal and lubricate the mesh fabric 26 to prevent undesirable ceramic ink build-up. Another means to reduce ink build-up is to use tear-shaped dots 46a in the mesh. As the squeegee moves across the screen, excess ceramic ink is directed away from the dot 46a at the tapered end of the tear-shaped dot 46a to reduce the undesirable accumulation of dried ink about the dot 46a.

Figure 6:
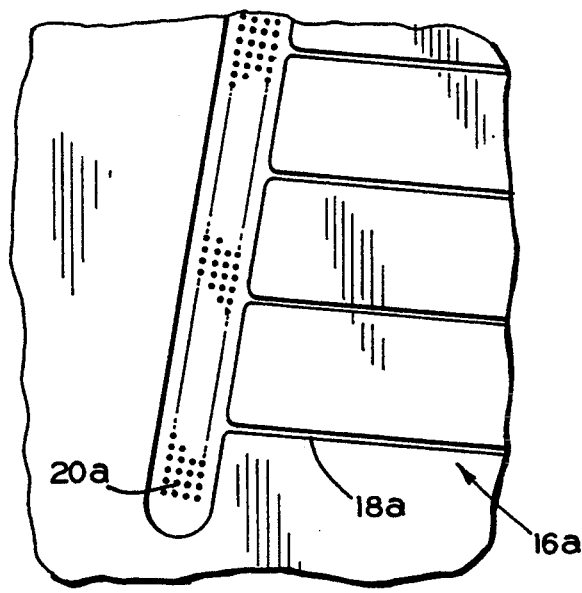
FIG. 6 is an enlarged fragmentary view of a piece of glass showing an exaggerated dot pattern for use on a side bus bar of a heater array.

The heater array 16 may require additional capacity in the bus bar 20 and conductors 18. FIG. 6 shows a portion of the transparency for a heater array 16a and conductors 18a with a bus bar 20a utilizing the dot pattern technology to achieve a thicker conductor 18a. The formation of the dot pattern of the present invention facilitates the deposit of a heavier paint using a thinner mesh fabric 26.

In addition to heater arrays 16, the screen printing technology may be used in a number of applications for automotive window glass and other industries. Automotive windows often include an obscuration band around all or a segment of the perimeter of the glass 14. The obscuration band hides unattractive metal working, mounting means, and wiring harnesses positioned under the edges of the window. The obscuration band is screen printed using a nonconductive ceramic paint or ink.

The ceramic paint used for the obscuration band had typically been a lead based paint. Because of the documented problems with lead paint, glass manufacturers are using lead-free paints. The lead-free paints are not as opaque as the lead paints. Consequently, more paint must be applied to the window to provide the desirable obscuration band. In order to achieve a heavier lead-free deposit of paint, thicker mesh fabric has been used on the obscuration bands. Problems have resulted from using a thicker fabric because of the break up of the electrical heater array.

Figure 8:
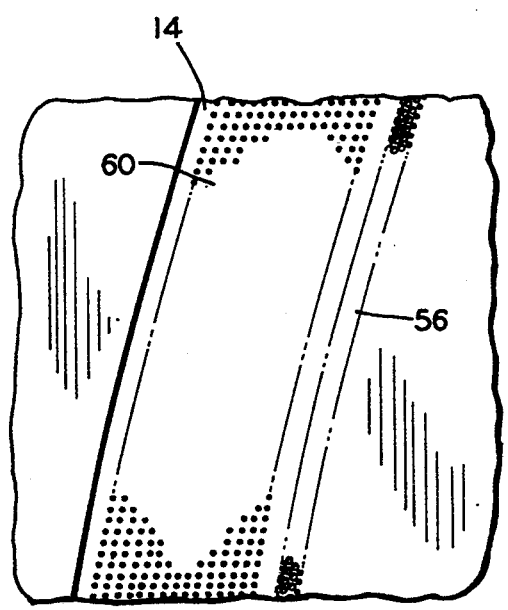
FIG. 8 is an enlarged fragmentary view of a piece of glass showing an exaggerated dot pattern for a wider obscuration band adjacent to the bus bar for a heater array.
Figure 7:
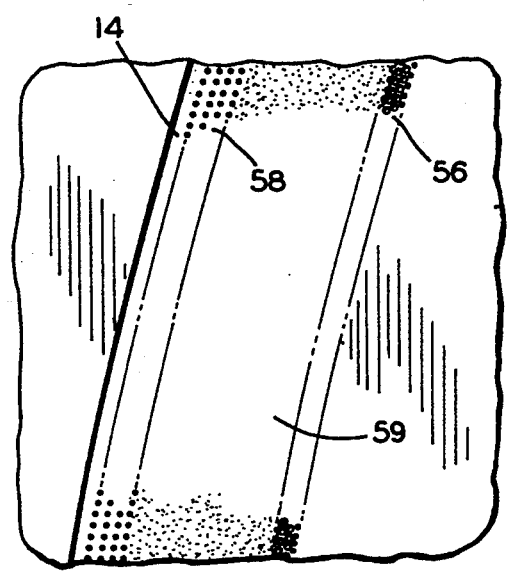
FIG. 7 is an enlarged fragmentary view of a piece of glass showing an exaggerated dot pattern for an obscuration band along the edge of a window.

FIGS. 7–8 show a piece of glass 14 provided with an obscuration band 59. The outer edge 56 of the obscuration band is a strip of dots in spaced apart relationship in order to achieve a fade-away look from a distant observer. If a lead-free paint is used, the majority of the band 59 may not require a special screen pattern. The raised emulsion dots 46 in pattern 58 will provide the strip of thicker paint to obscure the desired area under the glass 14. If the raised emulsion dots 46 are not used, then a thicker fabric is required to form the narrow band 58 in FIG. 7.

A screen having a thinner mesh may also be used when a wider obscuration band, such as band 60 in FIG. 8, so long as the raised dots 46 are utilized. The raised emulsion dots 46, which are twice as thick as the emulsion layer 34 for the rest of the screen, provide the desired layer of paint. The use of the dots 46 results in improved opacity for obscuration band 60 without breaking up the conductors on window 14.

The use of a thinner mesh results in thinner deposits of paint at the ends of the heater conductors 18, which reduces unwanted break up and cracking of the heater conductors 18. The use of the dots 46 permit a thicker layer of paint to be deposited only in the desired areas of band 60.

Figure 9:
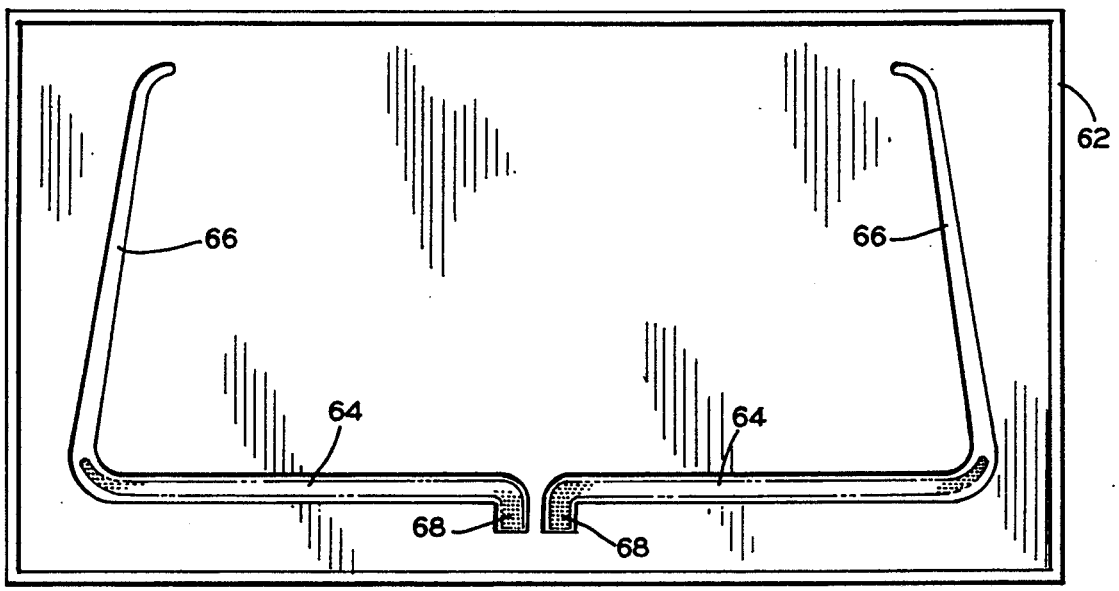
FIG. 9 is a diagrammatic view of the art work transparency used to produce a printing screen for printing a bus bar having an extended area of thicker ceramic ink to provide lower electrical resistance.

FIG. 9 shows a transparency 62 with artwork for a pair of bus bars 66. A higher current capacity may be required in the bus bars 66, consequently the resistance is decreased and current capacity increased by increasing the thickness of the bus bars 66 at the connection points 68 and the initial segments 64 of the bus bars 66. The dot pattern as shown in FIG. 5 may be used in segment 64 and 68 to provide the additional thickness of ink required to increase the current capacity of the bus bars 66.

Figure 10:
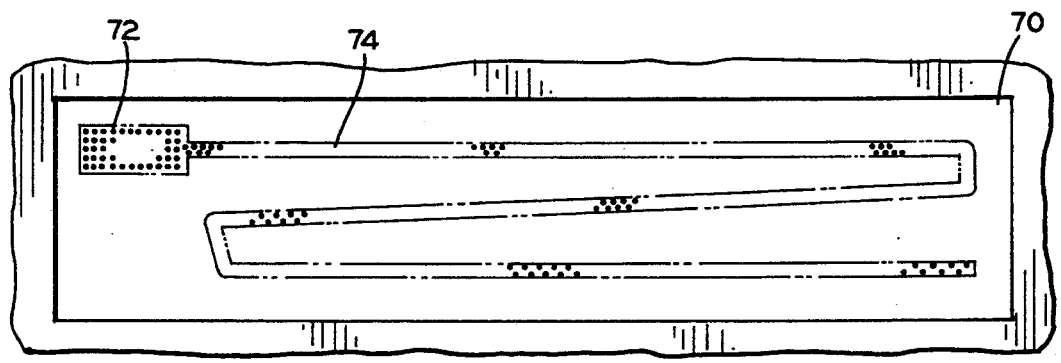
FIG. 10 is a diagrammatic view of a piece of glass or other hard substrate surface having an electrical circuit functioning as an antenna formed on the surface.
Figure 11:
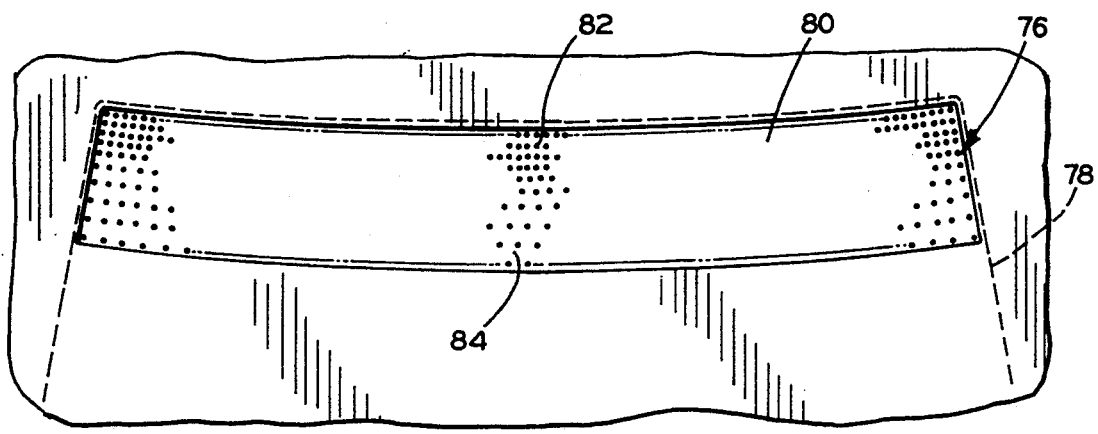
FIG. 11 is a diagrammatic view of the art work transparency used to produce a printing screen for forming a tinted section along an upper edge of a front windshield.

FIG. 10 shows a piece of glass 70, or other similar hard substrate surface, on which a current carrying circuit 74 with terminal block 72 is defined. Such a circuit may be formed not only on the glass 70, but on circuit boards and other similar application. The raised emulsion dots 46 provide a thicker layer of ceramic ink for conducting electrical current. The ceramic ink may be printed in a variety of circuit formations. The electrical circuit may be used for an antenna or other similar circuits. The ability to deposit a thick path of ceramic ink while using a thinner fabric is less expensive from both the cost of manufacturing a screen and the cost of operating a screening operation. In addition, the electrical circuit 74 may operate on an existing layer of ceramic ink, such as bus bar 66 of FIG. 9. The thicker layer of ceramic ink for an antenna current carrying circuit 74 may be formed using the raised dots 46 in the appropriate pattern.

The raised emulsion dots 46 may be increased or decreased to match the size of the mesh opening in other applications. A screen 12 may be constructed not only for automotive glass use, but also for a number of other applications where a pattern is printed on a hard substrate, such as circuit boards.

Finally, the raised emulsion dots 46 may also be used to tint windows, such as the sun screen 76 formed along the top edge of the wind shield 78. As noted above, the new non-lead paints are less opaque and require more paint to achieve the same shading as a lead based paint. The art work 80 for the shaded area includes a strip 82 of more concentrated dots along the top strip of the art work 80 and a more spaced-apart area of dots along the other edge of the artwork strip 82. The raised emulsion dots 46 provide a more effective screen without having to utilize a thicker fabric. As the pattern 84 spreads the dots further apart, the fabric begins to compress during production operations and the a thinner layer of tinted paint is formed on the glass 78. The spacing and the length of the dots may be adjusted to achieve the desired tint for the windshield 78.

Figure 12:
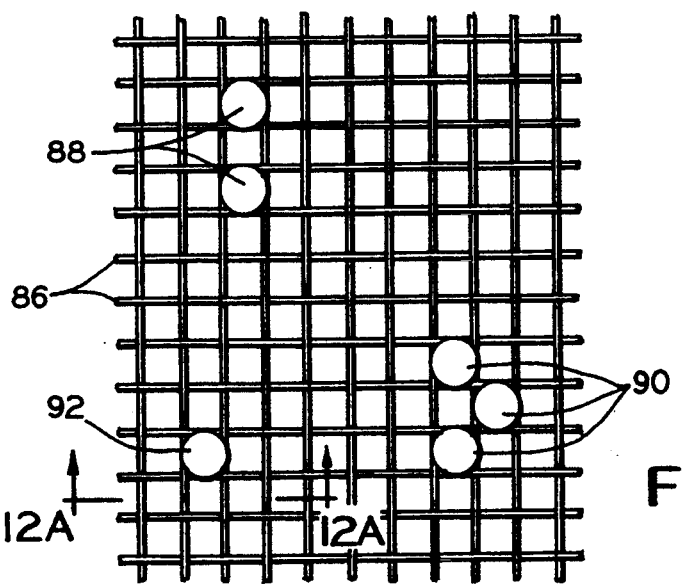
FIG. 12 is an enlarged plan view of the printing screen with an alternate dot pattern which results in a surface having upraised mounds in the area where thicker ceramic ink is desired.

FIG. 12 shows an alternative dot pattern which may be used to form a special pattern of ceramic ink. The dots 46 in FIG. 5 produce a raised segment 22, which is a thicker layer of ceramic ink. The segment 22 formed by the dot configuration shown in FIG. 5 would have a somewhat uniform thickness over the entire segment 22.

In FIG. 12, the distance between the dot patterns in mesh 86 is significantly greater than the distance between the dots 46 in mesh 26 of FIG. 5. The main goal is to provide sufficient spacing such that the excess ink from one pattern does not flow into and join the flow of ceramic ink from the adjacent patterns. This results in mounds 94 being formed on a standard layer of ceramic ink 96 on glass substrate 98. Depending on the type of ceramic ink being used, the dot patterns are spaced apart to achieve the desired arrangement of the mounds 94.

Figure 13:
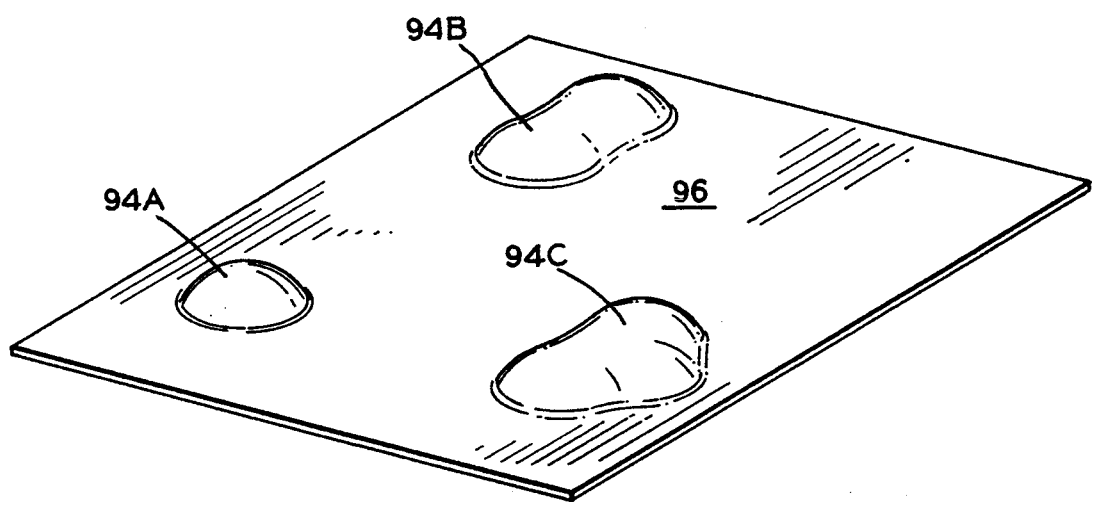
FIG. 13 is an enlarged perspective view of the surface having upraised mounds of ceramic ink produced by the dot pattern in FIG. 12.

Mesh fabric 86 includes a two dot sub-pattern 88 and a three dot sub-pattern 90 in addition to a single dot 92. The dot patterns in FIG. 12 result in mounds 94A, 94B, 94C being formed on the layer of ceramic ink 96 on glass substrate 98 in FIG. 13. The mounds 94 provide the same benefits as the raised segment 22 in most applications, but require less ceramic ink to print. The use of the mounds 94 may result in reasonable cost savings in production use by requiring less silver-based ceramic ink. In addition, the mounded layer of ceramic ink 96 with mounds 94 is less likely to crack or split after extended use on automobile glass. The method of forming the dots 88, 90, and 92 is the same as outlined above.

Figure 12A:
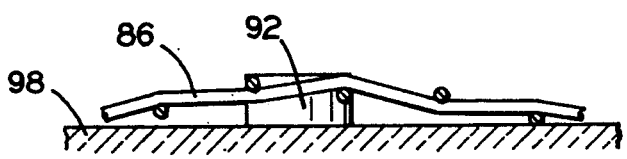
FIG. 12A shows a side view of the printing screen along lines 12A—12A of FIG. 12, the printing screen being positioned on a glass substrate for application of the ceramic ink.
Figure 12B:
FIG. 12B shows the glass substrate immediately after the ink has been applied and the printing screen removed.
Figure 12C:
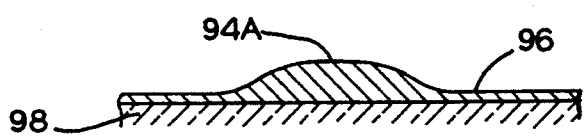
FIG. 12C shows the same glass substrate after the ink has filled to form the mound.

FIG. 12A shows a side view of the mesh 86 on a glass substrate 98 prior to the application of a ceramic ink. Immediately after the ceramic ink is applied and the mesh 86 is removed from the glass substrate 98, the substrate is coated with a layer of ink 96 which was deposited through the open areas in the mesh 86. Additional ink is deposited through mesh 86 around dot 92, the additional ink forming the mound 94A. In FIGS. 12B–12C, the center recess 100 caused by the removal of the mesh 86 is filled in by the ink flow to form mound 94A on glass substrate 98.

Sub-patterns of two or three dots are often preferred in this case to provide more support and reduce cracking when the squeegee is passed over the screen during the printing process. Because the sub-patterns of dots are spaced further apart, less squeegee pressure is required to force the ceramic ink through the mesh fabric 86, which results in longer screen life.

In accordance with the provisions of the patent statutes, the present invention has been described in what is considered to represent its preferred embodiment. However, it should be noted that the invention can be practiced otherwise than as specifically illustrated and described without departing from its spirit or scope.

What is claimed is:

1. An improved method for making a silk screen comprising:
    a) applying a first layer of photosensitive emulsion to a screen;
    b) securing a first transparency with a film pattern to the screen;
    c) exposing the first layer of emulsion on the screen to an ultraviolet light source;
    d) removing the first transparency and rinsing the screen to dissolve the unexposed emulsion beneath the pattern, whereby a pattern is defined by a first layer of exposed emulsion and open mesh areas in the screen;

e) applying a second layer of photosensitive emulsion to at least one open mesh area in the pattern such that the second layer of emulsion is thicker than the first layer of emulsion;

f) securing a second transparency with a second film pattern to the areas in which the second layer of emulsion has been applied, the second pattern including a dot arrangement;

g) exposing the second layer of emulsion to an ultraviolet light source; and h) removing the second transparency and rinsing the screen to dissolve the unexposed emulsion beneath the second pattern to form a second layer of exposed emulsion with emulsion dots, whereby the exposed emulsion dots are thicker than the first layer of exposed emulsion.

2. The method for making a screen defined in claim 1 wherein said method includes forming the second film pattern by arranging the dots in specific spaced-apart relationship.

3. The method for making a screen defined in claim 2 wherein the screen is provided with a specified mesh size, and forming the second pattern includes making each individual dot in the second transparency slightly smaller than an opening in the mesh of the screen.

4. The method for making a screen defined in claim 2 wherein arranging the dots in spaced-apart relationship includes increasing the spacing between adjacent dots at a periphery of the dot arrangement.

5. The method of making a screen defined in claim 2 wherein arranging the dots in spaced apart relationship includes increasing the spacing between adjacent dots in the second transparency such that the second pattern area is provided with an ink transfer pattern which forms a thin-layer deposit of ink with spaced-apart mounds.

6. The method for making a screen defined in claim 1 wherein applying the second layer of emulsion continues until the second layer of emulsion is approximately twice as thick as the first layer of emulsion.

7. The method for making a screen defined in claim 1 wherein applying the second layer of emulsion includes securing a capillary film to the screen.

8. The method for making a screen defined in claim 7 wherein the capillary film is applied to a glass-engaging side of the screen and the light source is positioned on the glass-engaging side of the screen for exposing the first and second layers of emulsion.

9. The method for making a screen defined in claim 1 wherein applying the second layer of emulsion includes applying a layer of clear emulsion to the screen.

10. An improved method for making a silk screen having a glass-engaging side and an ink side, said method comprising:

a) applying a first layer of photosensitive emulsion to an area of a screen and drying the emulsion;

b) applying and drying a second layer of photosensitive emulsion to a second area of the screen such that the second layer of emulsion is thicker than the first layer of emulsion, said second layer of emulsion including a layer of clear emulsion and a capillary film emulsion positioned on the glass engaging side of the screen;

c) securing a transparency having a first film pattern for the first layer of emulsion and a second film pattern for the second layer of emulsion, the second pattern including an arrangement of dots;

d) simultaneously exposing the first and second layers of emulsion to an ultraviolet light source from the ink side of the screen; and e) removing the transparency and rinsing the screen to dissolve the unexposed emulsion beneath the first film pattern to form a first layer of exposed emulsion and beneath the second film pattern to form exposed emulsion dots, whereby the exposed emulsion dots are thicker than the first layer of exposed emulsion.

11. An improved method of screen printing a pattern of ink on a non-absorbent substrate comprising:

a) preparing a screen by mounting a desired mesh fabric on a frame;

b) forming a first pattern on the mesh fabric defined by open mesh areas and a first layer of exposed emulsion;

c) forming a second pattern in the open mesh areas on the mesh fabric with a second layer of exposed emulsion such that the second layer of exposed emulsion is thicker than the first layer of exposed emulsion, said second pattern including a pattern of dots in space-apart relationship;

d) positioning the screen adjacent a substrate to be printed;

e) applying ink to the mesh fabric on the screen;

f) forcing ink through the open mesh areas on the mesh fabric to deposit a layer of ink on the substrate and to accumulate additional ink in the open mesh areas adjacent the dots; and g) forming a plurality of mounds on the substrate by repositioning the screen apart from the substrate such that the additional ink accumulated in the open mesh areas adjacent the dots is deposited on the substrate to form the plurality of ink mounds on the layer of ink in a pattern corresponding to the pattern of dots in the second pattern.

12. The method of screen printing a pattern on a non-absorbent substrate defined in claim 11 wherein forming a second pattern includes replacing individual dots in Spaced-apart relationship with sub-groups of at least two generally adjacent dots, the sub-groups of dots being arranged in spaced-apart relationship.

* * * * *